US010445446B2

(12) United States Patent
Shetty et al.

(10) Patent No.: US 10,445,446 B2
(45) Date of Patent: Oct. 15, 2019

(54) DISCRETIZATION SCHEME FOR SIMULATING PROPPANT TRANSPORT IN DYNAMIC FRACTURE NETWORKS

(71) Applicant: Halliburton Energy Services, Inc., Houston, TX (US)

(72) Inventors: Dinesh Ananda Shetty, Sugar Land, TX (US); Avi Lin, Houston, TX (US)

(73) Assignee: Halliburton Energy Services, Inc., Houston, TX (US)

( * ) Notice: Subject to any disclaimer, the term of this patent is extended or adjusted under 35 U.S.C. 154(b) by 309 days.

(21) Appl. No.: 15/515,986

(22) PCT Filed: Nov. 19, 2014

(86) PCT No.: PCT/US2014/066395
§ 371 (c)(1),
(2) Date: Mar. 30, 2017

(87) PCT Pub. No.: WO2016/080983
PCT Pub. Date: May 26, 2016

(65) Prior Publication Data
US 2017/0316130 A1 Nov. 2, 2017

(51) Int. Cl.
*G06F 17/50* (2006.01)
*E21B 43/267* (2006.01)
(Continued)

(52) U.S. Cl.
CPC ........ *G06F 17/5009* (2013.01); *E21B 43/267* (2013.01); *E21B 47/0002* (2013.01);
(Continued)

(58) Field of Classification Search
CPC ........ E21B 43/247; E21B 43/267; E21B 4/26; G06F 17/5009
(Continued)

(56) References Cited

U.S. PATENT DOCUMENTS 10,001,000 B2 * 6/2018 Kulkarni ................. E21B 43/26
10,241,232 B2 * 3/2019 Lin ....................... G01V 99/005
(Continued)

FOREIGN PATENT DOCUMENTS

WO 2016/080985 A1 5/2016
WO 2016/080988 A1 5/2016

OTHER PUBLICATIONS

International Search Report and Written Opinion issued in related PCT Application No. PCT/US2014/066395 dated Aug. 19, 2015, 10 pages.
(Continued)

*Primary Examiner* — Thai Q Phan
(74) *Attorney, Agent, or Firm* — John Wustenberg; Baker Botts L.L.P.

(57) ABSTRACT

In accordance with embodiments of the present disclosure, a discretization technique may be used to solve for fluid and proppant flow through a fracture within a dynamic fracture network. The discretization technique may involve performing a spatial discretization of non-linear coupled equations by integrating the equations over staggered finite control volumes. For example, the spatial discretization may involve integrating a continuity equation representing fluid flowing through the fracture over a first control volume along the length of the fracture, integrating a momentum equation representing the fluid flowing through the fracture over a second control volume that is staggered with respect to the first control volume, and integrating a proppant equation representative of the proppant flowing with the fluid through the fracture over the first control volume. The discretized equations may be used to determine a linear system of equations to simulate proppant flow through the dynamic fracture network.

20 Claims, 11 Drawing Sheets

(51) Int. Cl.
*E21B 47/00* (2012.01)
*E21B 49/00* (2006.01)
*G06F 17/11* (2006.01)
*E21B 43/26* (2006.01)

(52) U.S. Cl.
CPC .............. *E21B 49/00* (2013.01); *G06F 17/11* (2013.01); *E21B 43/26* (2013.01)

(58) Field of Classification Search
USPC .................................................... 703/2, 5, 7
See application file for complete search history.

(56) References Cited

U.S. PATENT DOCUMENTS

| | | |
|---|---|---|
| 2006/0129366 A1 | 6/2006 | Shaw |
| 2012/0158380 A1 | 6/2012 | Hajibeygi et al. |
| 2013/0204588 A1 | 8/2013 | Copeland |
| 2015/0066463 A1 | 3/2015 | Shetty et al. |
| 2016/0341850 A1* | 11/2016 | Lin ..................... E21B 41/0092 |
| 2016/0348489 A1 | 12/2016 | Balakrishnan et al. |
| 2017/0247998 A1* | 8/2017 | Shetty .................. E21B 43/267 |
| 2017/0298713 A1* | 10/2017 | Shetty .................. E21B 43/267 |
| 2017/0306737 A1* | 10/2017 | Shetty .................. E21B 43/247 |

OTHER PUBLICATIONS

Sarkar, Sudipta, M. Nafi Toksoz, and Daniel R. Burns. Fluid flow modeling in fractures. Massachusetts Institute of Technology. Earth Resources Laboratory, 2004. http://hdl.handle.net/1721.1/68616.

Ouenes, Ahmed, and Lee J. Hartley. "Integrated fractured reservoir modeling using both discrete and continuum approaches." SPE Annual Technical Conference and Exhibition. Society of Petroleum Engineers, 2000.

International Preliminary Report on Patentability issued in related Application No. PCT/US2014/066395, dated Jun. 1 2017 (7 pages).

* cited by examiner

DISCRETIZATION SCHEME FOR SIMULATING PROPPANT TRANSPORT IN DYNAMIC FRACTURE NETWORKS

CROSS-REFERENCE TO RELATED APPLICATION

The present application is a U.S. National Stage Application of International Application No. PCT/US2014/066395 filed Nov. 19, 2014, which is incorporated herein by reference in its entirety for all purposes.

TECHNICAL FIELD

The present disclosure relates generally to fracture flow simulations and, more particularly, to methods for discretizing equations governing fluid flow and suspended proppant transport in dynamic fracture networks.

BACKGROUND

Various techniques are designed and employed in the petroleum industry for the purpose of placing sand proppant in hydraulically induced fractures to enhance oil or gas flow through a reservoir to the wellbore. Hydraulic fracturing of petroleum reservoirs typically improves fluid flow to the wellbore, thus increasing production rates and ultimate recoverable reserves. A hydraulic fracture is created by injecting a fluid down the borehole and into the targeted reservoir interval at an injection rate and pressure sufficient to cause the reservoir rock within the selected depth interval to fracture in a vertical plane passing through the wellbore. A sand proppant is typically introduced into the fracturing fluid to prevent fracture closure after completion of the treatment and to optimize fracture conductivity.

Since these fracturing techniques are performed at relatively large depths under the Earth's surface, it can be difficult to predict or determine the distribution of sand proppant throughout a network of fractures within the wellbore. To realistically predict and simulate the effects of hydraulic fracturing processes, an accurate, and stable computational simulation of flows through the fracture network is needed. Some existing computational methods may utilize numerical methods to provide estimated flow simulations for fracture networks that are approximated as having relatively simple geometries.

Unfortunately, existing computational methods for modeling dynamic flows of fracture fluid and proppant through a fracture network have several drawbacks when used to model complex fracture networks. For example, large complex dynamic fracture networks (DFNs) may feature fractures with aperture areas that vary by orders of magnitude with respect to each other. The aperture areas can reach very small values in some parts of the DFN regions, thus causing existing numerical processes to become unstable. These numerical processes can become especially unstable for a hydro-fracturing process that extends for many hours of real time simulations.

BRIEF DESCRIPTION OF THE DRAWINGS

For a more complete understanding of the present disclosure and its features and advantages, reference is now made to the following description, taken in conjunction with the accompanying drawings, in which.

DETAILED DESCRIPTION

Figure 1:
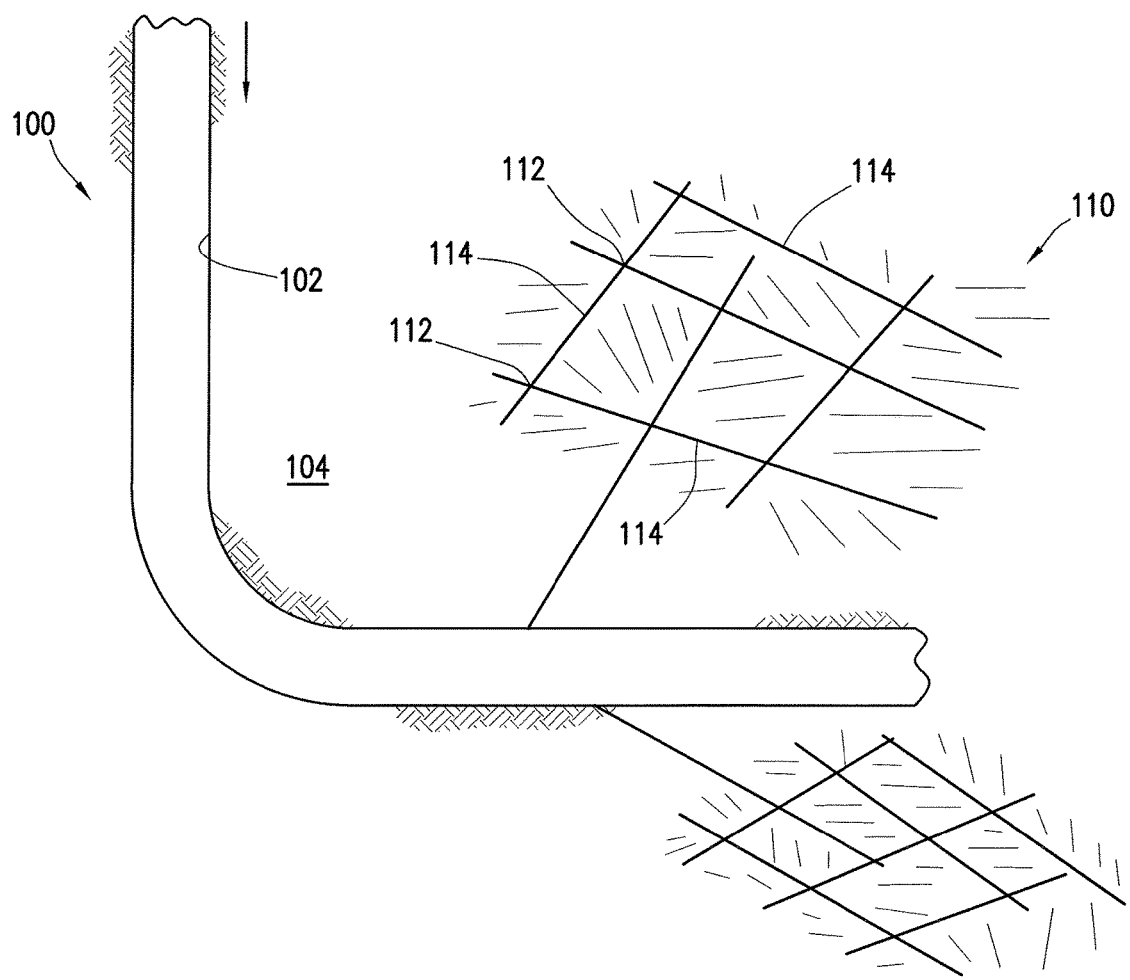
FIG. 1 is a diagram showing an example wellbore comprising fracture networks extending from the wellbore, according to aspects of the present disclosure.

For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communication with external devices as well as various input and output (I/O) devices, such as a keyboard, a mouse, and a video display. The information handling system may also include one or more buses operable to transmit communications between the various hardware components. It may also include one or more interface units capable of transmitting one or more signals to a controller, actuator, or like device.

For the purposes of this disclosure, computer-readable media may include any instrumentality or aggregation of instrumentalities that may retain data and/or instructions for a period of time. Computer-readable media may include, for example, without limitation, storage media such as a direct access storage device (e.g., a hard disk drive or floppy disk drive), a sequential access storage device (e.g., a tape disk drive), compact disk, CD-ROM, DVD, RAM, ROM, electrically erasable programmable read-only memory (EE-PROM), and/or flash memory; as well as communications media such wires, optical fibers, microwaves, radio waves, and other electromagnetic and/or optical carriers; and/or any combination of the foregoing.

Illustrative embodiments of the present disclosure are described in detail herein. In the interest of clarity, not all features of an actual implementation are described in this specification. It will of course be appreciated that in the development of any such actual embodiment, numerous implementation specific decisions must be made to achieve developers' specific goals, such as compliance with system related and business related constraints, which will vary from one implementation to another. Moreover, it will be appreciated that such a development effort might be complex and time consuming, but would nevertheless be a routine undertaking for those of ordinary skill in the art having the benefit of the present disclosure. Furthermore, in no way should the following examples be read to limit, or define, the scope of the disclosure.

Certain embodiments according to the present disclosure may be directed to a discretization technique that may be used to solve for fluid and proppant flow through a fracture within a dynamic fracture network. The discretization technique may involve performing a spatial discretization of non-linear coupled equations by integrating the equations over staggered finite control volumes. More specifically, the spatial discretization may involve integrating a continuity equation representing fluid flowing through the fracture over a first control volume along the length of the fracture, integrating a momentum equation representing the fluid flowing through the fracture over a second control volume that is staggered with respect to the first control volume, and integrating a proppant equation representative of the proppant flowing with the fluid through the fracture over the first control volume, along with other equations.

Embodiments of the present disclosure may include a computer system that is operable to receive inputs indicative of a property of the fracture, perform a spatial discretization of the Navier-Stokes equations with proppant transport by integrating the equations over the staggered finite control volumes along a length of the fracture, and determine a linear system of equations to solve for variables of the equations based on the spatial discretization. The computer system may then display a simulation representative of the flow of proppant through the fracture based on solutions determined for the linear system of equations.

The disclosed discretization technique may provide a conservative numerical methodology and a fast computational algorithm to accurately simulate fluid and proppant flow through a dynamic fracture network (DFN). The algorithm may perform computations using the full Navier-Stokes equations with proppant transport as governing equations. The disclosed computational methodology may enhance the stability of the discretization schemes through a combination of staggering the governing equations and the variables of the computation along the length of the fracture. As a result, the computational methodology may enable stable and efficient modeling of fracture flows through complex DFNs having fractures with widely varying aperture sizes.

Referring now to FIG. 1, an example hydrocarbon production system 100 is shown comprising a wellbore 102 extending through a formation 104, with at least one fracture network 110 within the formation 104 and connected to the wellbore 102. The formation 104 may comprise any subterranean geological formation suitable for fracturing, e.g., shale and/or any other formation having a low permeability.

The fracture network 110 may be created by any fracturing operation, as would be appreciated by one of ordinary skill in the art with the benefit of the present disclosure. The fracture network 110 may comprise a plurality of junctions 112 and a plurality of fractures 114 (or "flow paths"). A junction 112 may be found where at least 3 fractures 114 meet and/or intersect. Each fracture 114 may connect two junctions 112.

For explanatory purposes, the fracture network 110 shown by example in FIG. 1 contains a relatively low number of junctions 112 and fractures 114. A fracture network model may be created to simulate the flow of fluid through the fracture network. The fracture network 110 may be comprised of a wide range of junctions 112 and fractures 114. The number of junctions 112 and fractures 114 may vary drastically and/or unpredictably depending on the specific characteristics of the formation. For example, the fracture network 110 may comprise in the order of thousands of fractures to tens of thousands of fractures. In certain embodiments, the fracture network model is not limited to a number of fractures and junctions.

In certain embodiments, the geometry and/or orientation of the fractures and junctions within the fracture network may be determined using microseismic measurements or other geological imaging techniques. In certain embodiments, the model may build the geometry of the fracture network as a result of computational steps discussed herein. In certain embodiments, the apertures of the fractures may be computed by solving rock block deformation under fluid pressure.

Figure 2:
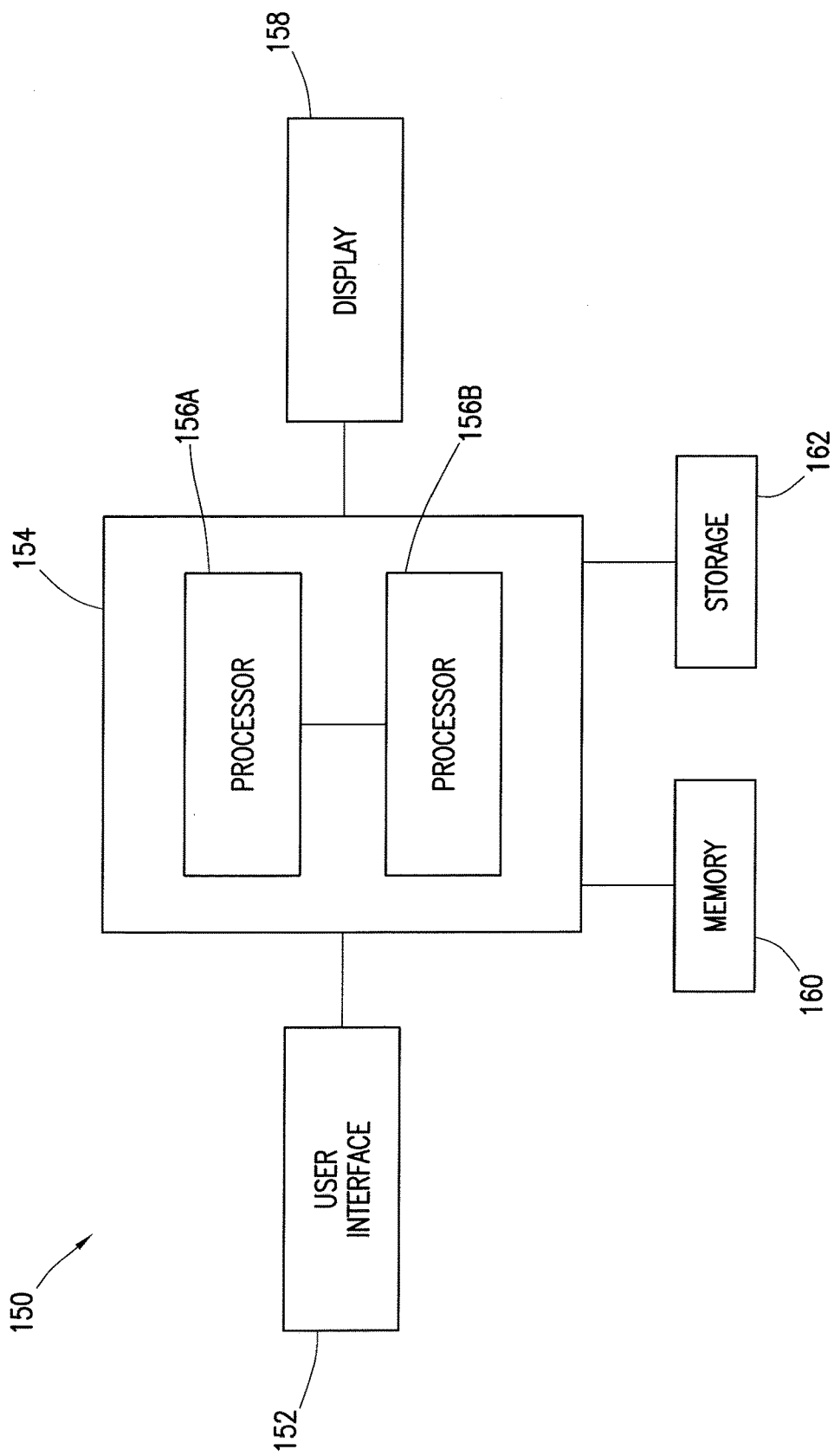
FIG. 2 is a schematic block diagram of a fracture flow simulation in accordance with an embodiment of the present disclosure.

FIG. 2 is a block diagram of a fracture flow simulation system 150 that may be used to construct the dynamic fracture network model and to simulate proppant flows through a dynamic fracture network via the model. As illustrated, the system 150 may include a user interface 152, a processor unit 154 having one or more processing components 156, a display 158, a memory 160, and a storage component 162. It should be noted that the illustrated system 150 is meant to be representative, and other fracture flow simulation systems 150 may include additional components or may operate in the absence of certain illustrated components.

The user interface 152 may be available for an operator or user to input parameters or properties of the dynamic fracture network that is being modeled. Such inputs may include, for example, information relating to the geometry of the fracture network, information relating to the formation material through which the fractures extend, or information relating to the number of fractures expected or the extent of the fracture network model. In addition, the inputs may include information relating to the desired method for modeling and simulating the dynamic fracture network, such as specific discretization schemes to be used or assumptions to be made at fracture junctions.

The illustrated processing unit 154 includes two processing components 156A and 156B coupled together. These processing components 156 may be designed to receive various inputs from the user interface 152 such as the geometry (e.g., aperture area along the length of the fractures) of the dynamic fracture network. In addition, the processing components 156 may be operably coupled to the memory component 160 and the storage component 162 to execute instructions for carrying out the presently disclosed techniques. These instructions may be encoded in programs that may be executed by the processing components 156 to generate the fracture network model and to simulate fluid and proppant flow through the fracture network model. These codes may be stored in any suitable article of manufacture that includes at least one tangible non-transitory, computer-readable medium (e.g., a hard drive) that at least collectively stores these instructions or routines, such as the memory component 160 or the storage component 162.

As illustrated, the processing unit 154 may include two processing components 156A and 156B, each component being designed to execute a different program in order to simulate the proppant flow through the fracture network. The distributed processing components 156A and 156B may be coupled to one another and used to generate and solve two sets of coupled linear equations. For example, one processing component 156A may compute and solve the set of linear equations relating to the fluid and proppant flow through individual fractures within the fracture network model. The other processing component 156B may compute and solve a set of linear equations relating to the fluid and proppant flow between a plurality of fractures as computed at the junctions of the fracture network model. These processing components 156 may be coupled together to exchange model variables determined using algorithms described below. For example, the processing component 156A may solve the set of linear equations for individual fractures in order to determine endpoint variables of the fracture. These endpoint variables may then be provided to the other processing component 156B, which may receive the endpoint variables and use these variables to solve the linear equations relating to a particular junction in the fracture network model. It should be noted that the sparse junction solver (i.e., processing component 156B) may be able to solve the linear sets of equations for all of the junctions within the model in parallel. Additional details regarding these computations are provided in later sections of the present disclosure. By distributing the computing between two processing components 156, one for individual fractures and the other for a sparse model of the junctions, the system 150 may provide simulations of the fluid and proppant flow through large fracture networks efficiently and with a high degree of accuracy.

The display 158 coupled to the processing unit 154 may be used to visibly display the fracture flow simulations computed via the processing components 156. The display 158 may output a plot, for example, as described in detail below, that shows the expected flow of proppant through the various fractures that make up the fracture network. However, in other embodiments the display 158 may provide other types of indications related to the simulated proppant and fluid flows through the network model.

Figure 3:
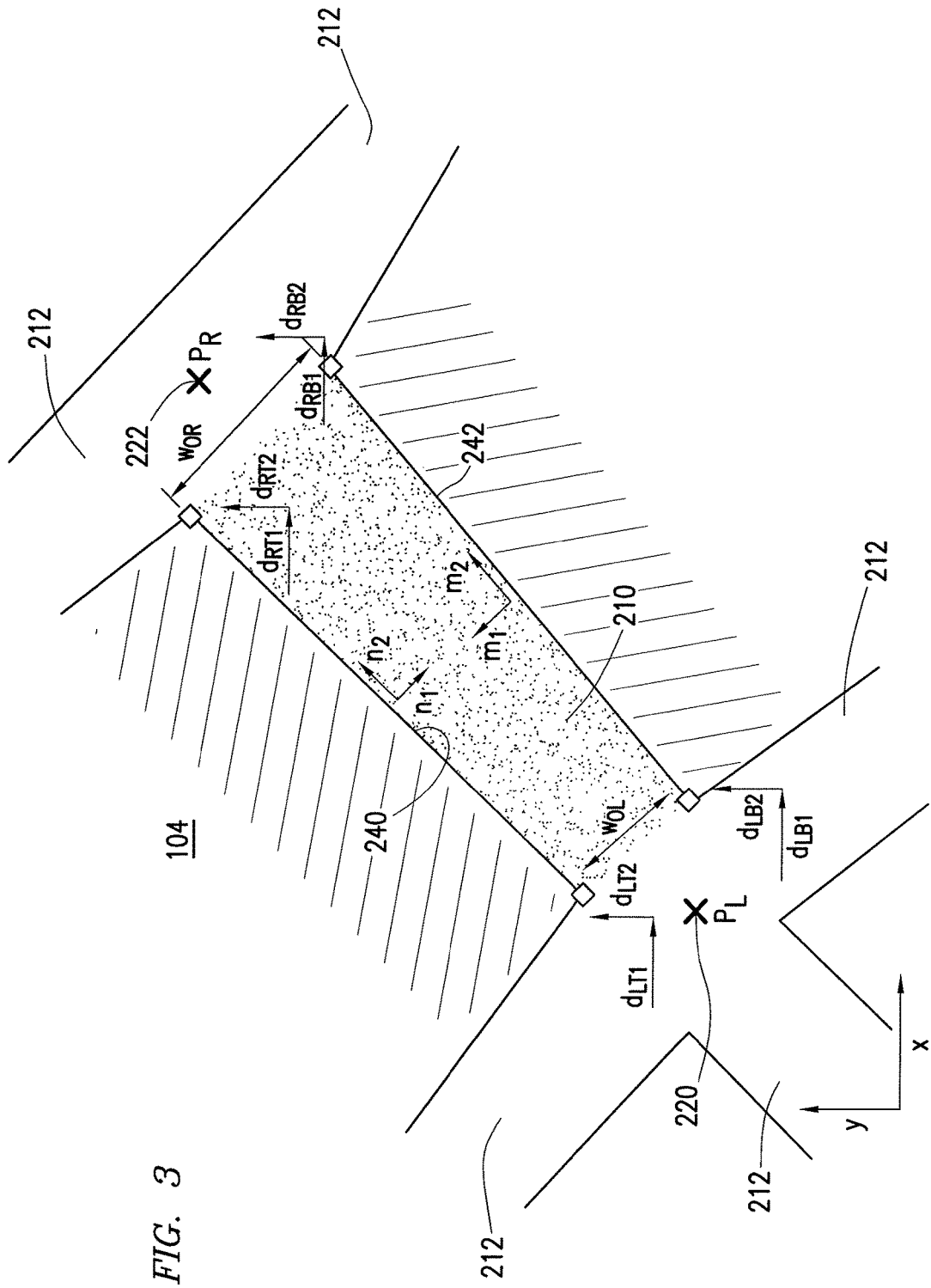
FIG. 3 is a diagram of an example fracture segment of a fracture network, according to aspects of the present disclosure.

Referring now to FIG. 3, an example fracture 210 of the fracture network is shown defined within the formation 104 and connecting a first junction 220 and a section junction 222. Fluid may flow between the junctions 220, 222 through the fracture 210. The junctions 220, 222 may connect the fracture 210 with a plurality of fractures 212 of the fracture network, where fluid may flow from the fracture 210 to the plurality of fractures 212 through the junction. As an example, the first junction 220 is shown as connected to four fractures and the second junction 222 is shown connected to three fractures, including the fracture 210. However, each junction 220, 222 may be connected to three or more fractures.

At the first junction 220, the fracture 210 may comprise a first top node 230 and a first bottom node 232 and at the second junction 222, the fracture 210 may comprise a second top node 234 and a second bottom node 236. The distance between the first nodes 230, 232 may define a first initial aperture width $W_{OL}$ and the distance between the second nodes 234, 236 may define a second initial aperture width $W_{OR}$.

In certain embodiments, the fracture 210 may be assumed to be linear between the first nodes 230, 232 and the second nodes 234, 236 (i.e., that width of the fracture 210 changes linearly along the length from the first junction 220 to the second junction 222).

The

The fluid flow through the fraction 210 may be represented by Equation A:

$$A(x, t) = (w_{0L} - d_{LT1}n_1 - d_{LT2}n_2 - d_{LB1}m_1 - d_{LB2}m_2)\left(1 - \frac{x}{L}\right) + \quad (A)$$
$$(w_{0R} - d_{RT1}n_1 - d_{RT2}n_2 - d_{RB1}m_1 - d_{RB2}m_2)\frac{x}{L}$$

where A is the actual aperture of the fracture, L is the fracture length; $n_1$ and $n_2$ are the normal components of a top rock surface 240; $m_1$ and $m_2$ are the normal components of a bottom rock surface 242; and the displacement components are indicated by the "d" variables as shown in FIG. 3.

Determining the fluid variables inside the fracture may be used by applying the Navier-Stokes equation and/or simplifications of the Navier-Stokes equation. For example, the Reynolds equation may be used, shown as Equation B:

$$\frac{\partial A}{\partial t} - \frac{\partial}{\partial x}\left(A^3 \frac{\partial P}{\partial x}\right) = 0 \quad (B)$$

where A is the fracture aperture (i.e., the cross sectional area of the fracture), and P is the fluid pressure. Equation 1 may be substituted into the discrete linearized version of Equation B, resulting in the following linear system of equations, referred to as Equation C:

$$\sum_{k=-p}^{k=p} \alpha_{i,k} P_{i+k} = C_i + a_L P_L + a_R P_R + m_1 f_i d_{LB1} + m_2 f_i d_{LB2} + n_1 f_i d_{LT1} + \quad (C)$$
$$n_2 f_i d_{LT2} + m_1 g_i d_{RB1} + m_2 g_i d_{RB2} + n_1 g_i d_{RT1} + n_2 g_i d_{RT2}$$

where 2p+1 represents the stencil size (node dependency), P is the pressure, $C_i$ is the discretization constant, and $a_L$, $a_R$, $f_i$ and $g_i$ are coefficients of discretization. A direct and/or indirect solution may be applied to Equation C, which may involve a total of 11 variable columns—1 constant, 8 displacement variables, and 2 boundary pressures. A variable transformation may be used to reduced the number of variable columns. For example, defining $d_L=m_1d_{LB1}+m_2d_{LB2}+n_1d_{LT1}+n_2d_{LT2}$ and $d_R=m_1d_{RB1}+m_2 d_{RB2}+n_1d_{RT1}+n_2d_{RT2}$, the linear system represented by Equation 3 may be written as Equation 4:

$$\sum_{k=-p}^{k=p} \alpha_{i,k} P_{i+k} = C_i + a_L P_L + a_R P_R + f_i d_L + g_i d_R \quad (D)$$

This equation may have a reduced number of variables to solve. For example, Equation D may have 5 variables—1 constant, 2 displacement variables, and 2 boundary pressures. Since the number of variables needed to compute is reduced, an overall computational cost of modeling the fracturing network as a system of individual fractures may be reduced accordingly.

For fractures where the first aperture and/or the second aperture is too small to be completely represented in a memory reserved variable of the computerized model (e.g., a double precision memory variable), solving the linear system for known variables may be sensitive to rounding errors. For example, if the fracture aperture is on the order of $10^{-3}$, then $A^3$ component would be on the order of $10^{-9}$, which may be too small to be accurately stored in a single precision memory variable. In certain embodiments, the model may represent each variable in a computer memory across two or more memory reserved variables. For example, a variable of the linear system may be stored in computer memory such that the first half of the variable's value may be stored in a first memory reserved variable and the second half may be stored in a second memory reserved variable (if two the linear system variable is stored in two memory reserved variables). For example, the memory reserved variables may be floating point type variables and/or double type variables. As such, In certain embodiments, the number of memory reserved variables used for each variable of the linear system may vary according to the level of rounding error impacting a given variable. For example, the number of memory reserved variables used to represent a given linear system variable may be increased if the rounding error increases and decreased if the rounding error decreases. In certain embodiments, the fracture network model may dynamically assign memory reserved variables to variables that have increased rounding error, and/or dynamically assign memory reserved variables away from variables that have decreased rounding error. Thus, in certain embodiments, each of the variables of Equation D may be represented over two or more memory reserved variables appended together, leading to the linear system shown in Equation E:

$$\sum_{k=-p}^{k=p} \alpha_{i,k} P_{i+k} = \quad (E)$$

$$\sum_{k1} C_{i,k1} + \sum_{k2} a_{L,k2} P_L + \sum_{k3} a_{R,k2} P_R + \sum_{k4} f_{i,k4} d_L + \sum_{k5} g_{i,k5} d_R$$

where the range of each k depends on the number of memory reserved variables used to store the particular variable of the discretized linear system. Since each variable may be stored over different numbers of memory reserved variables by the model, the range of k may also vary. In certain embodiments, two memory reserved variables may be used for each linear system variable (i.e., using two double precision memory reserved variables to create double-double precision).

Figure 4:
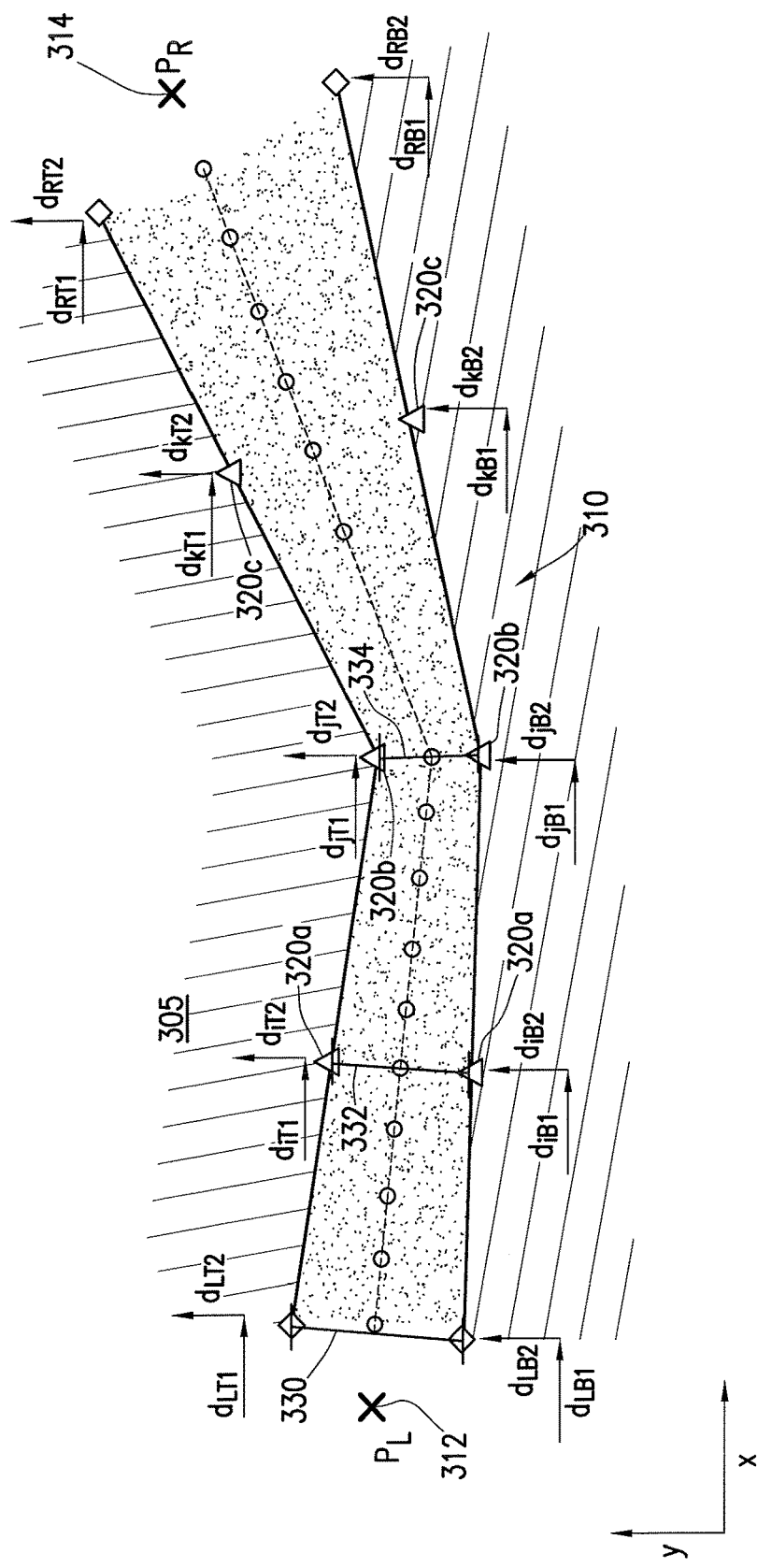
FIG. 4 is a diagram of an example fracture segment comprising key-points, according to aspects of the present disclosure.

Referring now to FIG. 4, a fracture 310 through a formation 305 is represented comprising at least one fracture node 320, according to certain embodiments of the disclosure. The fracture 310 may fluidly connect a first junction 312 and a second junction 314. Similar to the junctions described in FIG. 3, the junctions 312, 314 may be connected to a plurality of fractures (not shown in FIG. 4), where fluid may flow from one fracture to another fracture through the junction. In certain embodiments, the fracture 310 may have a first fracture aperture 330 at the first junction 312, a second fracture aperture 332 at a first fracture node 320a, and a third fracture aperture 334 at a second fracture node 320b.

Although the fracture 310 is represented as comprising three nodes 320a, 320b, 320c, the number of nodes 320 for a given fracture 310 may be increased if greater resolution for modeling the fracture is desired, or decreased if less resolution is required. In certain embodiments, decreasing the number of nodes for a fracture may reduce computational costs.

Figure 5:
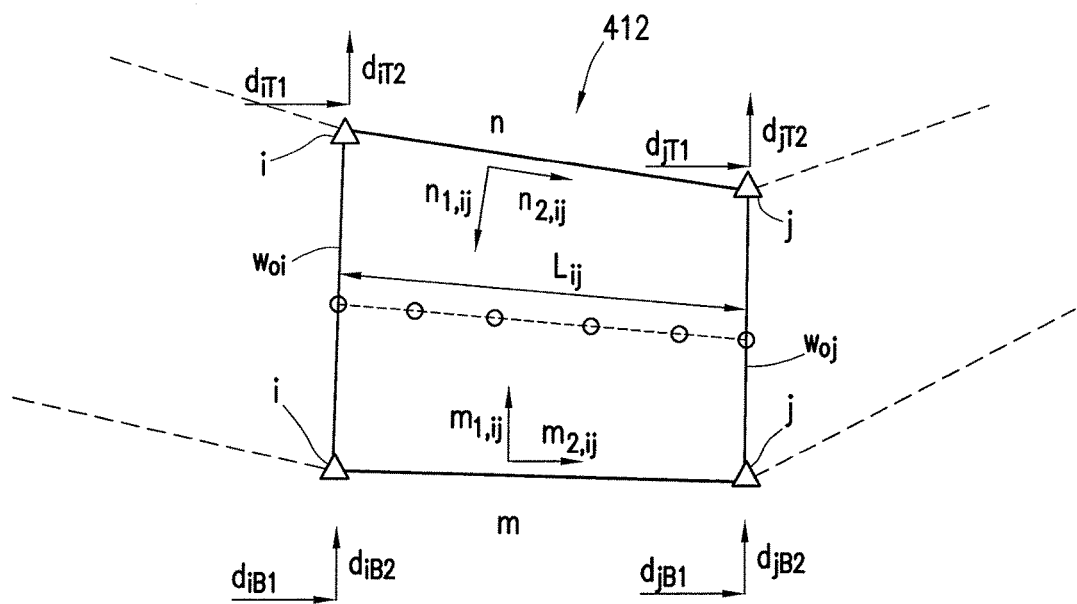
FIG. 5 is a diagram of an example fracture segment defined between two key-points, according to aspects of the present disclosure.

A fracture aperture comprising at least one fracture node 320 may broken into segments between any two fracture nodes 320 and/or between junction and fracture node. For example, referring now to FIG. 5, a segment 412 of the fracture is shown between fracture nodes 320a and 320b from FIG. 4, where fracture node 320a is represented as lengthwise point i and fracture node 320b is shown as lengthwise point j. The fracture segment 412 may be modeled linearly between any two points i, j, and be defined between a top formation wall n, and a bottom formation wall m. Similar to Equation (A), the fracture segment 412 between points i and j may be defined linearly as in Equation F:

$$A_{ij}(x,t) = (w_{0i} - d_{iT1}n_{1,ij} - d_{iT2}n_{2,ij} - d_{iB1}m_{1,ij} - d_{iB2}m_{2,ij})\left(1 - \frac{x}{L_{ij}}\right) + \quad (F)$$
$$(w_{0j} - d_{jT1}n_{1,ij} - d_{jT2}n_{2,ij} - d_{jB1}m_{1,ij} - d_{jB2}m_{2,ij})\frac{x}{L_{ij}}$$

where $w_{0i}$ and $w_{0j}$ are known initial apertures for the first point i and the second point j, respectively, $L_{ij}$ represents the length of the segment, the outward normal components of the top formation wall is indicated as $n_{1,ij}$ and $n_{2,ij}$, the outward normal components of the bottom formation wall is indicated as $m_{1,ij}$ and $m_{2,ij}$, the displacement components for each point are indicated by d variables with subscripts corresponding to those shown in FIG. 5, and the variable x represents the local chord length measured along the fracture. Similar equations may represent each of the other fracture segments that make up the fracture.

The fluid variables inside the fracture segment may be determined using the Navier-Stokes Equation, or a simplification of the Navier-Stokes Equation, such as the Reynolds Equation discussed above as Equation B:

$$\frac{\partial A}{\partial t} - \frac{\partial}{\partial x}\left(A^3 \frac{\partial P}{\partial x}\right) = 0 \quad (B)$$

Figure 6:
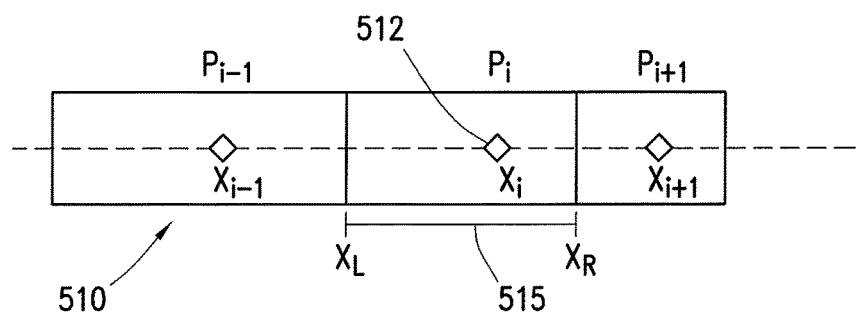
FIG. 6 is an illustration showing an example fracture comprising a plurality of key-points, according to aspects of the present disclosure.

In certain embodiments, spatial derivative terms may be found at the node point i and/or j by imposing a conservative formulation of Equation B, while using a finite-volume cell, as shown by example in FIG. 6. FIG. 6 illustrates a fracture cell 515 with a finite-volume within a fracture 510, where the fracture cell 515 is defined between points $X_L$ and $X_R$ that bound the node point i 512. The fracture cell 515 does not need to be uniform along the fracture 510, which may allow different sizes of fracture cell meshes on either side of the node point i. Thus, the size of the fracture cells may be adjusted according to the amount of resolution desired and may take the available computational resources into account. As used herein, "computational resources" means resources that may be allocated by a computer system used to model the fracture network, such as processor cycles and/or allocable memory. For example, using larger fracture cells may reduce computational resolution and also reduce the amount of computational resources needed because fewer fracture cells would need to be calculated. In certain embodiments, the fracture network model may determine the number of fracture cells to compute dynamically according to the computational resources available and a desired computation frequency. For example, if the model is set to update every 5 minutes, the fracture network model may dynamically determine the number of fracture cells possible to calculate every 5 minutes.

In certain embodiments, the fracture nodes and/or fracture cells may be placed with varying intervals along the fracture, as shown by example in FIG. 6. For example, the distance between two nodes may be variable. In certain embodiments, the fracture network model may set positions for the fracture nodes and/or fracture cells dynamically depending on computational resources and/or desired resolution for a given fracture or fracture segment. For example, the fracture network model may allocate more fracture cells to a region of interest compared to surrounding areas of the fracture network. The plurality of fracture cells may create a fracture mesh.

Application of spatial integration over the fracture cell to Equation B results in Equation G:

$$\frac{\partial \tilde{A}}{\partial t} - \frac{1}{x_R - x_L}\left[\left(A^3 \frac{\partial P}{\partial x}\right)_{x_R} - \left(A^3 \frac{\partial P}{\partial x}\right)_{x_L}\right] = 0 \quad (G)$$

where $$\tilde{A} = A\left(\frac{x_L + x_R}{2}\right),$$

and the pressure gradient terms may be discretized to second order accuracy due to the unique meshing strategy proposed here, for example as $$\frac{\partial P}{\partial x} = \frac{P_i - P_{i-1}}{x_i - x_{i-1}}.$$

A temporal scheme (e.g., the Crank-Nicolson scheme) and linearization scheme can be applied to Equation G to complete the spatial-temporal discretization of the governing equation. From this linear system internal elimination in terms of junction pressure, corner point displacement, and/or fracture node point displacement may be accomplished.

As mentioned above, the fluid variables inside the fractures may be determined using the Navier-Stokes equations or its simplification, and these equations may be linearized using a desirable discretization technique. In some embodiments, this linearization of the Navier-Stokes equations may be performed using a finite volume discretization scheme. This type of scheme may enable computational simulation of the non-linear system in an accurate and stable manner. Specifically, the disclosed finite volume discretization scheme may provide a framework for obtaining stable solutions to the system of non-linear coupled equations, such as the Navier Stokes and suspended proppant transportation equations. Thus, the disclosed computational method may provide a set of efficient algorithms that are able to perform realistic, physically conservative, and stable simulations of the dynamic fracture network's (DFN's) complex flows.

Again, the governing equations for wellbore and fracture flows may include the Navier-Stokes equations or its simplifications, such as Reynolds (or Stoke's) approximations which are relevant for low Reynolds number flows. A discretization scheme is discussed in detail below and demonstrated for the Navier-Stokes equations and for a fully suspended proppant transport model. However, it should be noted that the disclosed discretization scheme may be applied to other combinations of non-linear coupled equations, not just the Navier-Stokes equations. For example, discretization of these equations may be extended easily for subset flow regimes. In addition, the scheme may be applicable for all other proppant models or appropriate governing equations.

For simplicity and clarity, the discretization scheme is illustrated for Navier-Stokes and proppant transport equations in one dimension (1-D), i.e., along the fracture. However, it should be noted that the resultant techniques and algorithms may be extended to solve for multi-dimensional (2-D or 3-D) flows as well. The 1-D time-dependent governing equations for the flow inside the fractures are provided in equations 1-6 below.

$$\frac{\partial A\rho}{\partial t} + \frac{\partial A\rho u}{\partial x} = 0 \quad \text{Continuity equation (1)}$$

$$\frac{\partial A\rho u}{\partial t} + \frac{\partial A\rho u^2}{\partial x} + AP_x - \frac{\partial}{\partial x}\mu\frac{\partial Au}{\partial x} + F_P = 0 \quad \text{Momentum equation (2)}$$

$$\frac{\partial A\phi}{\partial t} + \frac{\partial A\phi u}{\partial x} = 0 \quad \text{Proppant equation (3)}$$

$$\mu = f(\phi, P, \ldots) \quad \text{Viscosity model (4)}$$

$$\rho = f(\phi, P, \ldots) \quad \text{Density model (5)}$$

$$A = f(P, E, \ldots) \quad \text{Pressure model (6)}$$

In these equations, ρ represents the mixture density of the fracture fluid, and μ represents the mixture viscosity of the fracture fluid. In addition, φ represents the proppant volumetric fraction (e.g., solid proppant to fluid ratio, fluid proppant to fluid ratio), and P represents the fluid pressure, which is also shared by the proppant. The variable A represents the cross sectional area, which can be fracture aperture or the wellbore area; u represents the axial fluid velocity through the fracture or the wellbore; $F_p$ represents a wall friction force; and E is the Young's modulus of the wall. For cases where the fracture is coupled with the oil/gas reservoir, the continuity equation (1) may also include contributions from the leak-off/flow-back mass flow rate of fluid from the reservoir. Although these terms are omitted in the following example for simplicity, the presently disclosed computational algorithms may be applicable to these situations without any significant modifications to the discretization scheme.

Before applying the discretization method directly to the Navier-Stokes and proppant transport equations, an example is provided below to demonstrate the basic discretization scheme. The basic discretization scheme is illustrated using a generalized example where the following three coupled equations (a), (b), and (c) are considered in their conservative form.

$$\frac{\partial \xi}{\partial t} + \frac{\partial \xi \eta}{\partial x} = S_1 \quad (a)$$

$$\frac{\partial \eta}{\partial t} + \frac{\partial}{\partial x}\left(\frac{\eta^2}{\xi}\right) + \beta = S_2 \quad (b)$$

$$\frac{\partial \beta}{\partial x} = S_3 \quad (c)$$

In equations (a), (b), and (c) above, the symbols $\xi$, $\eta$ and $\beta$ represent the variables to be solved for in the discretized equations. The variables $S_1$, $S_2$ and $S_3$ represent known source terms, and x and t represent the independent spatial and time coordinates of the coupled system of equations, respectively. The generalized governing equations (a), (b), and (c) may include a similar structure to the complete Navier-Stokes and proppant transport equations 1, 2, and 3 listed above. The equations may be one-dimensional and time-dependent.

In order to solve for the unknown variables, the equations (a), (b), and (c) may be mapped to and integrated with respect to discrete space. In some embodiments, the computational approach for the conservative numerical schemes may involve discretizing the system via a finite volume method. The finite volume method may generally involve discrete spatial integration over a small spatial region, known as a control volume. The use of control volumes for integrating the above equations may be particularly desirable for the conservative governing equations above, since controlled volumes are geometric entities capable of maintaining conservation across the volume. When solving for the three unknown variables of the governing equations a, b, and c, there may be several possibilities for the spatial arrangement of the variables as well as their control volumes.

One example of an arrangement of the variables and control volumes is described below. FIG. 1 illustrates a control volume 500 over which the first equation (a) may be integrated. The control volume 500 may be centered around one of several discrete points 502 (e.g., i−1, i, i+1, ...) along the length of the fracture 504. The temporal integration of the $\xi$ variable of equation (a) may be determined at the point 502 (e.g., i) surrounded by the control volume 500. The spatial integral is determined across the control volume 500, from one face 506 (i.e., a) to an opposite face 506 (i.e., b). In the discretized form across the control volume 500, the equation (a) may expressed according to the following equation 7. In equation 7, the terms $(\xi\eta)_a$ and $(\xi\eta)_b$ represent the values of $\xi\eta$ at each respective face 506 and 508 of the control volume 500, while h represents a length of the fracture 504 between the faces 506.

$$\frac{\partial \xi_i}{\partial t} + \frac{(\xi\eta)_b - (\xi\eta)_a}{h} = S_{1,i} \quad (7)$$

It should be noted that neither $\xi$ nor $\eta$ are immediately available at the control volume faces 506 (a and b) for evaluating the above expression. The values of the variable under the temporal derivative (i.e., $\xi$) at the faces 506 may be interpolated via upwind interpolation. Upwind interpolation refers to using a known value of the variable (i.e., $\xi$) taken at a discrete point (e.g., 502) immediately adjacent (on one side or the other) of the face being evaluated. This upwind interpolation method may be particularly desirable for use with hyperbolic equations such as the governing continuity equation (a). The term "hyperbolic equation" herein refers to equations that have both a temporal derivative and a separate spatial derivative.

The upwind operation may represent an operation that moves or shifts the values of a variable known at one of the adjacent points 502 to the face 506 being evaluated. Such upwind interpolation of the variable values, in order to solve the coupled system of equations may be relatively advantageous compared to other techniques for estimating the values. For example, interpolation schemes that average the variable values at two available points or use other external equations to perform the estimations may reduce the stability of the computation of the variables, add unnecessary bulk to the computation, introduce additional errors, and ultimately reduce the efficiency and accuracy of the simulation method.

The upwind operation for estimating $\xi$ on the cell face 506 may be performed based on the sign of the $\eta$ value on the cell face 506. For example, if the value of the variable $\eta$ is positive at the face b, the upwind value of $\xi$ at the point i may be used as the interpolated variable $\xi$ at face b. However, if the value of the variable $\eta$ is negative at the face b, the upwind value of $\xi$ at the point i+1 may be used as the interpolated variable $\xi$ at face b. Since the upwind interpolation of the variable $\xi$ depends on the sign of the variable $\eta$ on the cell face 506, a very accurate estimate of $\eta$ on the cell face 506 is desired.

In the disclosed discretization method, the locations of the variables solved for in the governing equations may be staggered relative to each other along the length of the fracture. Specifically, the locations of the variables $\eta$ and $\xi$ may be staggered relative to each other, along with respective control volumes centered over each variable. For example, the variable $\eta$ may be staggered relative to the variable $\xi$ such that $\xi$ is solved for at the point 502 in the center of the control volume 500 while $\eta$ is solved for at locations on the cell faces 506. This staggering approach may facilitate a very accurate upwind approximation for $\xi$ on each of the cell faces 506, since the variable $\eta$ may be accurately solved for directly at the cell faces 506.

Staggering $\eta$ with respect to $\xi$ may also eliminate any possible odd-even decoupling phenomenon that might otherwise occur when solving the non-linear coupled system of equations via interpolation operations of $\eta$ at the cell face. Odd-even decoupling may refer to the tendency of solutions for non-linear equations to become unstable when all the terms or variables are determined at a single point (e.g., 502). By moving one of the terms (e.g., $\eta$) off the point 502 slightly, the non-linear system may be solved without upsetting the stability of the computations.

Another advantage of the staggered scheme is that truncation error of the governing equation may be dependent on only a single variable (i.e., upwind interpolation variable). Upon staggering the positions (cell faces 506) where η is being solved relative to the points 502 where ξ is being solved, the quantity determined by spatial integration of η over the control volume 500 may be exact. Thus, the only error in solving the system of equations may be from the interpolation of ξ at the cell faces 506. The interpolation does not feature any additional error based on the sign of η, since η is directly solved for at the cell faces 506.

Applying spatial integration to the second generalized equation (b) may yield the following expression shown in equation 8.

$$\frac{\partial \eta_j}{\partial t} + \frac{(\eta^2/\xi)_{bb} - (\eta^2/\xi)_{aa}}{h} + \beta_j = S_{2,j} \qquad (8)$$

Figure 8:
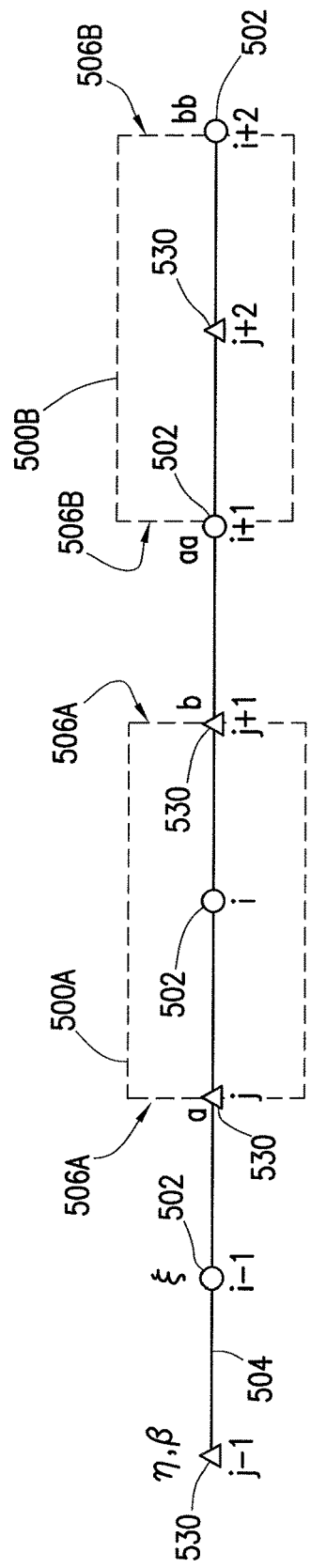
FIG. 8 is a schematic representation of two control volumes in a variable arrangement for integration of two coupled equations along a fracture, in accordance with an embodiment of the present disclosure.

To solve this equation, another control volume (similar to the illustrated control volume 500) may be centered about the temporal derivative variable (e.g., η in this equation). FIG. 8 illustrates two control volumes 500 that are shifted with respect to each other. The first control volume 500A represents the volume for equation (a), while the second control volume 500B represents the shifted volume for equation (b). As illustrated, the first control volume 500A is centered around the point 502 (i.e., i) along the fracture 504, and the second control volume 500B is centered around a point 530 (i.e., j+2) located between two adjacent points 502 (i.e., i+1 and i+2). The points 502 and the points 530 may be discrete points staggered and alternated relative to each other at equal intervals along the length of the fracture 504. Accordingly, the points 502 may be collocated with the cell faces 506B of the second control volume 500B while the points 530 may be collocated with the cell faces 506A of the first control volume 500A. The cell faces 506A of the first control volume 500A are labeled a and b, and the cell faces 506B of the second control volume 500B are labeled aa and bb.

Figure 7:
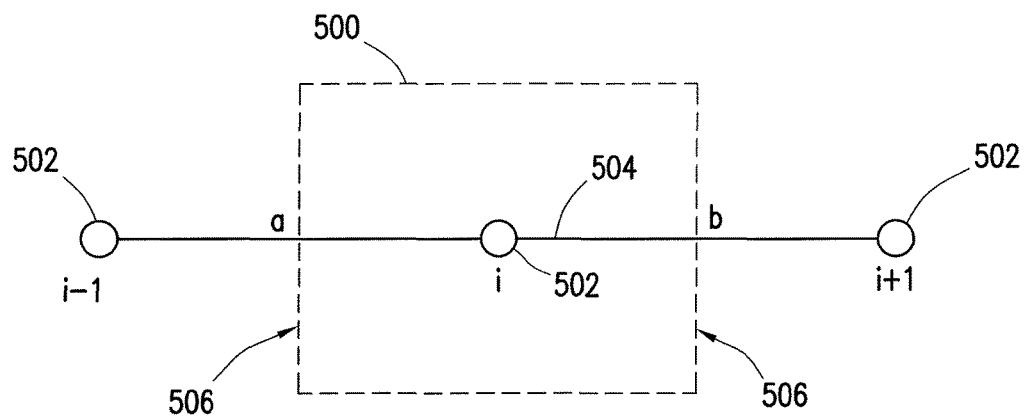
FIG. 7 is a schematic representation of a control volume selected for integration of a generalized equation along a fracture, in accordance with an embodiment of the present disclosure.

As illustrated, the second control volume 500B may be shifted relative to the initial control volume 500A of FIG. 7. As described above, the variables ξ and η may already be staggered with respect to each other, such that the points 502 where ξ is solved are positioned at the cell faces 506B of the second control volume 500B. Accordingly, no interpolation for ξ is needed on the cell faces 506B of the second control volume 500B, since the exact value is available. The η variable on the cell faces 506B may be computed using an appropriate upwind operation based on the sign of ξ across the cell faces 506B. In the second control volume 500B, the variable β may be collocated with η at the point 530.

A similar spatial integration of the third generalized equation (c) across the second control volume 500B may lead to the following equation 9.

$$\frac{\beta_{bb} - \beta_{aa}}{h} = S_{3,j} \qquad (9)$$

As shown in the expression above, the third variable β may be integrated over the second control volume 500B, which is disposed about the point 530. However, the type of integration generally provided in equation 9 may lead to instability in solving the system due to odd-even decoupling. Specifically, the variable β may be collocated with η at the point 530, as noted above, and therefore may not be known at the cell faces 506B. To avoid the odd-even decoupling that could arise from the above expression, the control volume used for equation (c) may be shifted relative to the variable β itself. Thus, the equation may be rewritten as equation 10 below. This integration is performed over the first control volume 500A, instead of the second control volume 500B.

$$\frac{\beta_{j+1} - \beta_j}{h} = S_{3,bb} \qquad (10)$$

The outcome of the numerical approach described above results in the control volume and variable arrangement depicted in FIG. 8. As illustrated, the disclosed discretization scheme may be used to combine the variables and generalized equations (a), (b), and (c) in a staggered fashion. This staggered arrangement may be used to maintain a robust algorithm to perform simulations of the non-linear coupled system of equations. That is, the staggered arrangement shown in FIG. 8 may yield a series of computations that may remain stable and operable during simulations made for a variety of dynamic fracture networks.

Figure 9:
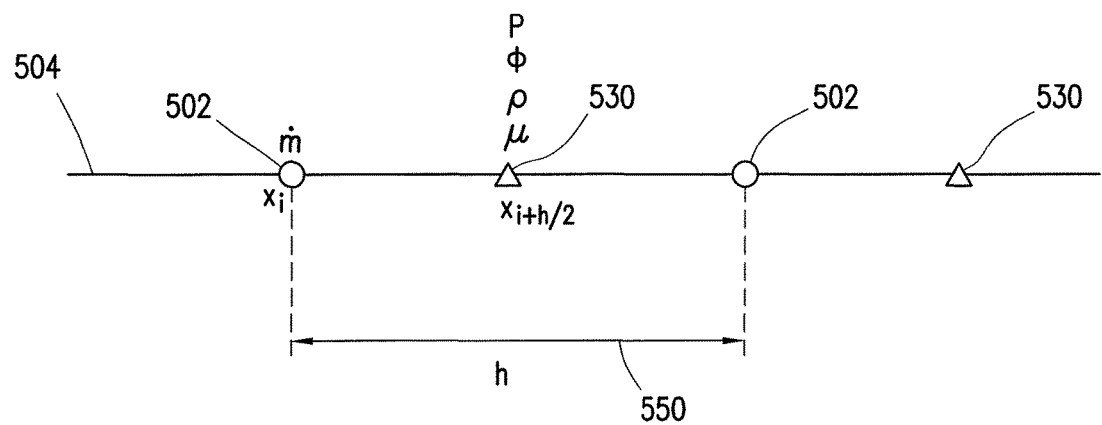
FIG. 9 is a schematic representation of a staggered variable arrangement for points at which different variables of a set of governing Navier-Stokes equations may be determined, in accordance with an embodiment of the present disclosure.

Having now discussed the discretization approach used for simulations in the context of generalized equations (a), (b), and (c), an example showing utilization of this approach for Navier-Stokes equations with discrete proppant transport in a DFN will be provided. That is, the approach described above may be applied to the full equations 1-6 that describe fluid and proppant flow. The disclosed discretization methodology may optimize the locations of the variables present in governing equations 1-6, as well as the location of the governing equations themselves. Specifically, the variables may be arranged as shown in FIG. 9, whereby the vector type variables are staggered with respect to the scalar type variables. This arrangement leads to staggered discretizations of the governing equations, similar to those described above.

In some embodiments of the discretization method, the governing equations 1, 2, and 3 may be expressed in terms of a transformed vector variable ṁ=Aρu, which represents the mass flow rate of fluid through the fracture. With this transformed variable ṁ, the computational method used to solve the equations may avoid a spatial interpolation within the time derivative terms. Thus, the disclosed method for solving the governing equations 1, 2, and 3 may not rely on a spatial interpolation. The spatial interpolation operator needed by other schemes may not be in line with the governing Navier-Stokes equations and, as a result, may induce inherent instabilities and provide an inadequate solution to the equations. In addition, the use of the transformed variable ṁ may enhance the stability of the new discretization scheme. Using the transformed variable ṁ, the governing equations 1, 2, and 3 may be transformed to the following system of equations 11, 12, and 13.

$$\frac{\partial A\rho}{\partial t} + \frac{\partial \dot{m}}{\partial x} = 0 \qquad \text{Continuity equation (11)}$$

$$\frac{\partial \dot{m}}{\partial t} + \frac{\partial \dot{m}^2/(\rho A)}{\partial x} + AP_x - \frac{\partial}{\partial x}\mu\frac{\partial \dot{m}/\rho}{\partial x} + F_P = 0 \qquad \text{Momentum equation (12)}$$

$$\frac{\partial A\phi}{\partial t} + \frac{\partial \phi\dot{m}/\rho}{\partial x} = 0 \qquad \text{Proppant equation (13)}$$

As illustrated in FIG. 9, the scalar variables P, φ, ρ, and μ are solved for at the point 530 along the fracture 504, and the vector variable ṁ is solved for at the point 502. As before, the points 530 alternate with the points 502 along the fracture 504, and these points may be staggered equidistant from each other. The distance between any two adjacent scalar points 530 may equal the distance between any two adjacent vector points 502, and this distance 550 may be equal to the variable h.

As discussed above, some embodiments of the fracture branch being evaluated may not have a constant aperture (i.e., A in the equations) along the length of the fracture. For the general computational case, the number and locations of the discrete nodes that form the boundaries of the fracture (e.g., as shown in FIG. 4) may not match the discrete nodes (e.g., points 502 and 530) along the fracture. Accordingly, some embodiments of the disclosed techniques may enable a well-defined approximation or model for variations in the internal aperture area. For example, without loss of generality, a linear fracture aperture variation may be approximated according to the following equation 14.

$$A(x, t) = (w_{0L} - d_{LT1}n_1 - d_{LT2}n_2 - d_{LB1}m_1 - d_{LB2}m_2)\left(1 - \frac{x}{L}\right) + \qquad (14)$$
$$(w_{0R} - d_{RT1}n_1 - d_{RT2}n_2 - d_{RB1}m_1 - d_{RB2}m_2)\left(\frac{x}{L}\right)$$

In equation 14, the variables $w_{0L}$ and $w_{0R}$ may represent the known initial clearance of the fracture on its left and right ends respectively, and L may represent the length of the fracture. The variables $n_1$ and $n_2$ may represent the outward normal and tangential components for the top rock surface forming a boundary of the fracture. The variables $m_1$ and $m_2$ may represent the normal and tangential components for the bottom rock surface forming a boundary of the fracture. The variable d may represent displacement components indicated with appropriate subscripts. As discussed above, a typical fracture configuration is illustrated in FIG. 3. New variables $d_L$ and $d_R$ may be used to provide a compact representation of the fracture aperture area as a function of space and time, according to the equations 15, 16, and 17 below.

$$d_L = m_1 d_{LB1} + m_2 d_{LB2} + n_1 d_{LT1} + n_2 d_{LT2} \qquad (15)$$

$$d_R = m_1 d_{RB1} + m_2 d_{RB2} + n_1 d_{RT1} + n_2 d_{RT2} \qquad (16)$$

$$A(x, t) = (w_{0L} - d_L)\left(1 - \frac{x}{L}\right) + (w_{0R} - d_R)\frac{x}{L} \qquad (17)$$

Figure 10:
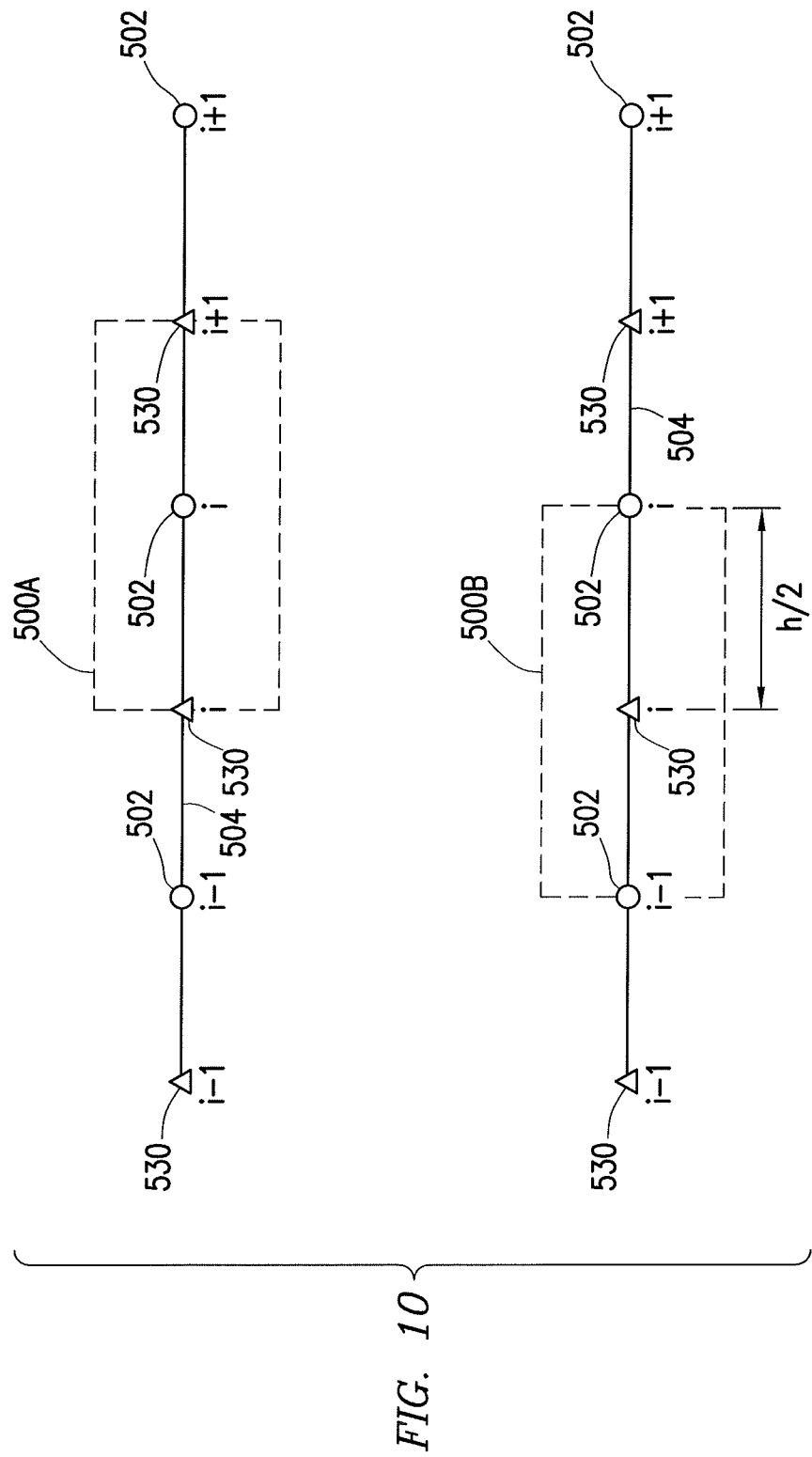
FIG. 10 is a schematic representation of two control volumes staggered relative to each other along a fracture for integration of a set of governing equations over the control volumes, in accordance with an embodiment of the present disclosure.

The transformed governing equations 11, 12, and 13 may be solved using the staggering discretization scheme. FIG. 9 depicts the staggering methodology of the discretization scheme, where the variables as well as the governing equations are spatially staggered. FIG. 10 depicts an appropriate numbering scheme that may be adopted so that a block solver may be implemented to efficiently solve the resulting discrete linear system. As illustrated, the different sets of alternating points 502 (i.e., triangles) and 530 (i.e., circles) may be indexed (i.e., i−1, i, i+1, . . . ), with the points 502 located on the left hand side of the corresponding points 530 having the same index value. However, it should be noted that other methods of discretizing and computing the solutions to the governing equations may utilize other numbering schemes.

Similar to the generalized example shown above, the finite volume approach may be utilized to discretize the governing equations 11, 12, and 13. The control volumes 500 employed for the discretization are illustrated in FIG. 10. The first control volume 500A may be used for the transformed momentum equation 12, while the second control volume 500B may be used for the transformed continuity equation 11 and the transformed proppant equation 13. It may be desirable to use the same control volume 500B for both the continuity equation 11 and the proppant equation 13, since these two equations have a similar hyperbolic structure. Since the momentum equation 12 has a significantly different structure from the other equations, it may be integrated over the control volume 500A, which is shifted by approximately a length h/2 relative to the control volume 500B.

The continuity and the proppant transport equations 11 and 13 may be integrated over the control volume 500B to yield the following equations 18 and 19, respectively.

$$\frac{\partial (A\rho)_i}{\partial t} + \frac{\dot{m}_i - \dot{m}_{i-1}}{h} = 0 \qquad (18)$$

$$\frac{\partial (A\phi)_i}{\partial t} + \frac{\dot{m}_i \widetilde{\left(\frac{\phi}{\rho}\right)_i} - \dot{m}_{i-1} \widetilde{\left(\frac{\phi}{\rho}\right)_{i+1}}}{h} = 0 \qquad (19)$$

In equation 19, the terms $\widetilde{(\phi/\rho)}_i$ and $\widetilde{(\phi/\rho)}_{i-1}$ may be approximated using the upwind interpolation described above, based on the sign of $\dot{m}_i$ and $\dot{m}_{i-1}$. In other embodiments, the terms may be approximated using higher order upwind fluxes. The momentum equation may be integrated over the control volume 500A following a similar procedure as laid out above with reference to the generalized equation 8.

The spatial discretization performed via integration across the control volumes 500 may then be followed by an appropriate temporal discretization and second-order linearization for each of the equations. Using a second-order linearization for all terms of the integrated equations, including the upwind approximations, may yield a consistent solution to the coupled equations. The term "consistent" generally means that the solutions for the variables will match up to solve the governing equations 11, 12, and 13 along each internal fracture interval of length h, as well as along the entire length of the fracture 504 from end to end.

Figure 11:
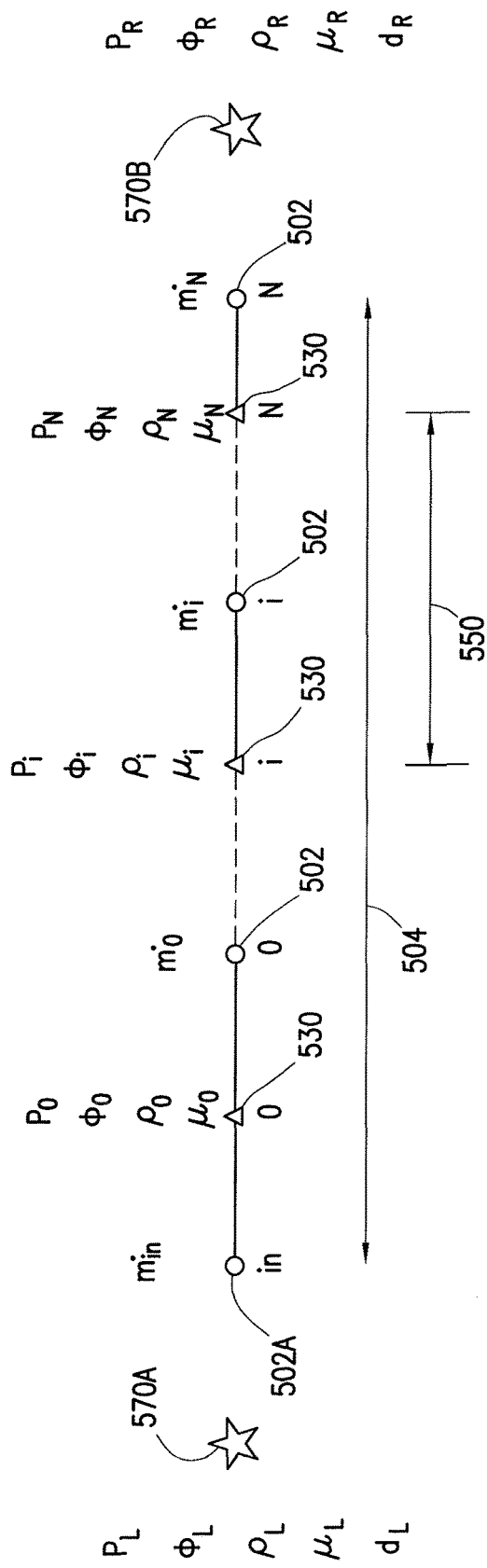
FIG. 11 is a schematic representation of a staggered variable arrangement related to an internal flow through a fracture, in accordance with an embodiment of the present disclosure.

The spatial discretization, temporal discretization, and second-order linearization operations may result in a penta-diagonal system that can be solved or eliminated efficiently. FIG. 11 illustrates one fracture 504 (e.g., part of a larger fracture network) and the variables being solved for at certain points along the fracture 504 via the disclosed discretization method. In order to solve the overall fracture network efficiently, each of the fractures (e.g., 504) may first undergo internal elimination. That is, all the internal variables of the fracture 504 may be expressed and eliminated in terms of a set of junction variables. As illustrated, the junction variables may be located on star symbols 570 at opposite ends of the fracture 504. Following a certain computational approach, all the internal variables (e.g., variables with the index 0 to N) and the left junction pressure $P_L$ may be eliminated in terms of $\dot{m}_{in}$, $\rho_L$, $\mu_L$, $d_L$, $P_R$, $\rho_R$, $\mu_R$, and $d_R$. In order to obtain $P_L$, the momentum equation may be solved at the initial point 502A (location denoted as "in").

In order to facilitate the evaluation at the fracture end points 570, either a zero gradient assumption can be made for all the quantities that lie outside the domain of the fracture 504, or a renormalization technique may be utilized.

The techniques described above, such as the compact representation and high precision formulation, can also be utilized during the internal elimination step. Thus after the internal elimination, the following relationships may be obtained at each internal node 502 and 530, as shown in equations 20 and 21.

$$\begin{bmatrix} \dot{m} \\ P \\ \phi \\ \rho \\ \mu \end{bmatrix}_i = \begin{bmatrix} k_m \\ k_P \\ k_\phi \\ k_\rho \\ k_\mu \end{bmatrix}_i + \dot{m}_{in} \begin{bmatrix} a_m \\ a_P \\ a_\phi \\ a_\rho \\ a_\mu \end{bmatrix}_i + P_R \begin{bmatrix} b_m \\ b_P \\ b_\phi \\ b_\rho \\ b_\mu \end{bmatrix}_i + \rho_L \begin{bmatrix} c_m \\ c_P \\ c_\phi \\ c_\rho \\ c_\mu \end{bmatrix}_i + \rho_R \begin{bmatrix} d_m \\ d_P \\ d_\phi \\ d_\rho \\ d_\mu \end{bmatrix}_i + \qquad(20)$$

$$\mu_R \begin{bmatrix} e_m \\ e_P \\ e_\phi \\ e_\rho \\ e_\mu \end{bmatrix}_i + \mu_R \begin{bmatrix} f_m \\ f_P \\ f_\phi \\ f_\rho \\ f_\mu \end{bmatrix}_i + d_L \begin{bmatrix} g_m \\ g_P \\ g_\phi \\ g_\rho \\ g_\mu \end{bmatrix}_i + d_R \begin{bmatrix} l_m \\ l_P \\ l_\phi \\ l_\rho \\ l_\mu \end{bmatrix}_i + \phi_L \begin{bmatrix} y_m \\ y_P \\ y_\phi \\ y_\rho \\ y_\mu \end{bmatrix}_i + \phi_R \begin{bmatrix} z_m \\ z_P \\ z_\phi \\ z_\rho \\ z_\mu \end{bmatrix}_i$$

$$P_L = \qquad(21)$$
$$k + a\dot{m}_{in} + bP_R + c\rho_L + d\rho_R + e\mu_L + f\mu_R + gd_L + ld_R + y\phi_L + z\phi_R$$

This conservative internal elimination approach may be readily used for hydraulic fracturing simulations and other applications. The disclosed discretization technique may provide an accurate, stable, and conservative scheme for solving proppant laden flows in a dynamic fracture network, such as those encountered in various hydraulic fracturing processes.

Having now described an accurate and stable discretization of the governing Navier-Stokes and proppant transport equations, a method for performing a fracture flow simulation using the sparse system of junction variables determined by the above techniques will be provided. The system at this point is sparse, meaning that all the variables (including internal fracture variables) may be solved for in terms of the junction variables listed above. Upon solving the linearized system of the fracture network in the junction domain, hydraulic fracturing simulations may easily be determined for the internal fractures based on the junction variables. Again, the relationships between these variables may be governed by the full Navier-Stokes equations with proppant transport, making the method relatively robust compared to simulation techniques that rely heavily on approximations.

The most general and reliable approach for solving the fracture flows may utilize the Navier-Stokes equations (or its simplification) with proppant transport. An accurate and stable discretization of these governing equations has been described above. The disclosed method may utilize a set of appropriate and optimal general algorithms to computationally solve the connection conditions on the sparse junction system. The junction system is the outcome of the internal elimination step, which may be performed for each of the fractures in the DFN. These algorithms for solving the junction system may be used to construct a related sparse solver that implements the connection conditions of the system. In a preliminary local step, all of the fractures may undergo internal elimination procedures, and in some embodiments the implementation of these operations may be completely executed in parallel. That is, the internal elimination for each of the local fractures may be determined at the same time to relate variables at the internal fracture nodes to junction variables at the junctions.

After the internal local elimination, for any internal node, the fracture variables may be readily obtained, and may be formulated in the compact representation presented above in equations 20 and 21. However, it should be noted that other representations of the fracture variables may be utilized in other embodiments. For example, a high precision representation may be used in some embodiments to provide improved accuracy.

As mentioned above with respect to FIG. 11, the left junction pressure $P_L$ may be eliminated along with the other internal variables from the points indexed 0 to N. Thus, in the illustrated embodiment, the value of $\dot{m}$ may be provided at the left end 570A of the fracture 504 while the value of P may be provided on the right end 570B. The rest of the quantities (i.e. $\phi$, $\rho$, $\mu$, and d) are provided at both junction ends 570. Thus, the two quantities ($\dot{m}$ and P) at the ends may be used to represent the orientation of the fracture 504. The physical domain of fracture 504 may be assumed to exist between $\dot{m}_{in}$ and $\dot{m}_N$, as shown in FIG. 11.

At a junction of the fracture network where several fractures 504 meet, at least one of the fractures 504 should be oriented with the $\dot{m}$ end condition, and at least another fracture 504 should be oriented with the P end condition. One or more algorithms may be utilized to order the fractures 504 in a way that is consistent with this junction condition. In some embodiments, other sets of end variables may be used at the boundaries to assign an orientation of the fractures 504 relative to one another. For example, in other embodiments, the fractures 504 may include a value of $\rho$ at just one end (e.g., 570A), as well as a value of P provided at the opposite end (e.g., 570B) to assign the orientation of the fracture 504 relative to other fractures meeting at a junction. However, these boundary conditions may ultimately yield solutions to the variables that are not unique.

Figure 12:
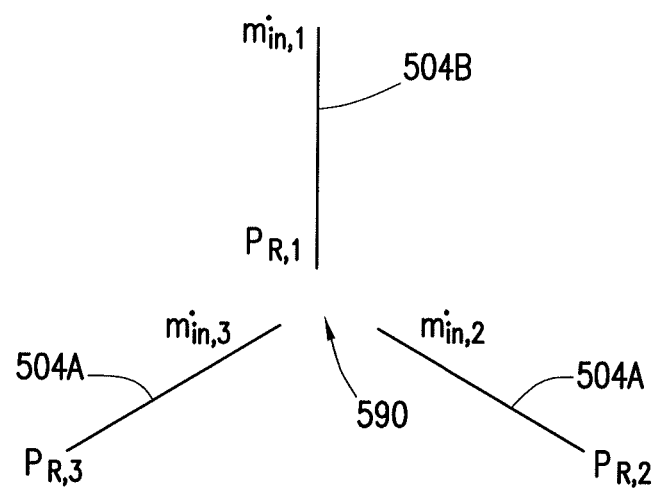
FIG. 12 is a schematic representation of an arrangement of fractures coinciding at a junction, in accordance with an embodiment of the present disclosure.
Figure 13:
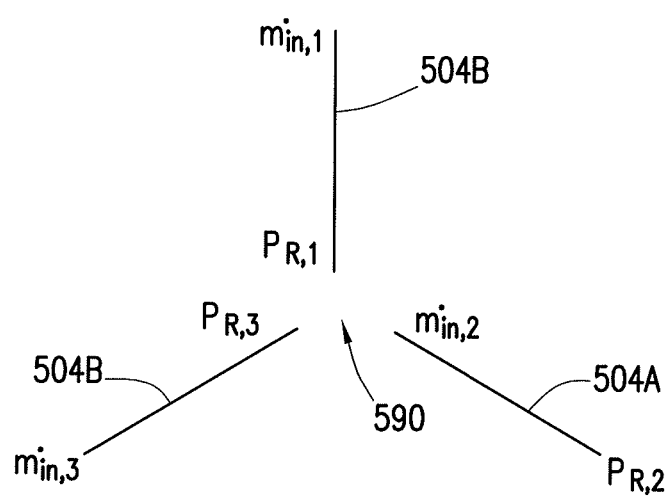
FIG. 13 is schematic representation of another arrangement of fractures coinciding at a junction, in accordance with an embodiment of the present disclosure.

FIGS. 12 and 13 illustrate two embodiments of a junction 590 at the meeting of three fractures 504. These junctions 590 may be solved in accordance with the present disclosure. As noted above, each of the junctions 590 in FIGS. 12 and 13 include at least one fracture 504 with the known $\dot{m}$ end condition and at least one fracture 504 with the known P end condition at the junction 590. Specifically, FIG. 12 shows two fractures 504A with $\dot{m}$ end conditions at the junction 590, and one fracture 504B with a P end condition at the junction 590. Similarly, FIG. 13 shows one fracture 504A with the $\dot{m}$ end condition at the junction 590, and two fractures 504B with the P end conditions at the junction 590. Although the figures illustrate three-fracture junctions 590, it should be noted that the other junctions 590 may form the meeting point for any desirable number of fractures 504 greater than or equal to three (e.g., 3, 4, 5, 6, 7, 8, 9, 10, or more fractures).

Having established the orientations of the fractures 504 meeting at a given junction 590, it is desirable to provide fluid conditions that are in effect at each junction 590. For example, the overall continuity of mass flow rate may be enforced at each junction 590, according to the expression given in equation 22 below.

$$\Sigma \dot{m} = 0 \qquad(22)$$

To illustrate an appropriate numerical implementation of this continuity condition, the following example represents a general expression of the continuity condition at a junction 590 that consists of $N_1+N_2$ branches (i.e., fractures) 504. In this example, $N_1$ is the number of branches with the $\dot{m}$ end condition at the junction 590, and $N_2$ is the number of branches with P end conditions at that junction 590. Using this orientation direction, the continuity equation 22 may be split into two terms, as shown in equation 23.

$$\sum_{j=1}^{N_1} \dot{m}_{in,j} - \sum_{k=1}^{N_2} \dot{m}_{N,k} = 0 \quad (23)$$

In equation 23, the j index may represent the fractures 504 with the ṁ end conditions at the junction 590. Likewise, the k index may represent the fractures with the P end conditions at that junction 590. Equation 23 is a basic equation for the mass flow continuity at a junction 590 where the area of the junction 590 is expected to remain stable in time. In embodiments where the junction area changes with respect to time, a transient version of the mass continuity condition may be use, as shown in equation 24 below. In this equation, the variable $A_J$ may represent the area of the junction 590 at a given time, and $\rho_J$ may represent the fluid density at the junction 590.

$$\frac{\partial \rho_J A_J}{\partial t} + \sum \dot{m} = 0 \quad (24)$$

In addition to the continuity equation, $N_1+N_2-1$ additional equations may be specified in order to obtain a unique solution to the junction variables. These additional equations may be based on the Navier-Stokes momentum equations at the junction 590. For simplicity, it may be desirable to assume pressure continuity at the junctions 590, as an estimate for the momentum equations. This assumption provides a relatively accurate model for momentum conservation at the junctions 590, since the fluid flow rate at the junctions 590 may be relatively low compared to the junction pressure. This pressure continuity model suggests that the following equations 25-27 may be imposed at the junctions 590. These equations represent a "shared P" condition at the junction 590. It should be noted that, in some embodiments, more accurate conditions may be used in the algorithm based on additional terms from the Navier-Stokes momentum equations.

$$P_{R,N2} = P_{L,N1} \quad (25)$$

$$P_{R,k} = P_{R,k-1}, \text{ for all } k=N_2, N_2-1, \ldots, 2 \quad (26)$$

$$P_{L,j} = P_{L,j-1}, \text{ for all } j=N_1, N_1-1, \ldots, 2 \quad (27)$$

After obtaining the desired $N_1+N_2$ equations (e.g., mass continuity and pressure continuity) needed to solve for the junction variables, the expressions for $\dot{m}_N$ and $P_L$ (from equations 20 and 21) may be substituted into the junction continuity equations. For example, the substitution based on the momentum equation may be solved to determine the P at the junction endpoint of the second branch 504 in FIG. 13. This substitution may result in a linear system that may be used to solve for the junction variables.

To illustrate the algorithm that performs this substitution, an example is provided for a simple case consisting of three branches 504. There are two possibilities for orienting these branches 504, as shown in FIGS. 12 and 13. In FIG. 12, the junction 590 has only one P end condition and in FIG. 13 the junction 590 has only one ṁ end condition.

For the case of FIG. 12, the mass continuity condition may be expressed according to the following equation 28. In addition, the pressure continuity conditions may be expressed according to equations 29 and 30. Similar mass continuity and pressure relationships for the junction 590 of FIG. 13 are provided in equations 31-33 below.

$$\dot{m}_{in,2} + \dot{m}_{in,3} - \dot{m}_{N,1} = 0 \quad (28)$$

$$P_{R,1} = P_{L,2} \quad (29)$$

$$P_{L,2} = P_{L,3} \quad (30)$$

$$\dot{m}_{in,2} - \dot{m}_{N,3} - \dot{m}_{N,1} = 0 \quad (31)$$

$$P_{R,1} = P_{L,2} \quad (32)$$

$$P_{L,2} = P_{R,3} \quad (33)$$

Proppant conditions may also be determined at each junction 590, in addition to the fluid conditions described above. These proppant conditions may include, for example, a proppant volume flowrate continuity condition that is imposed at the junction according to equation 33.

$$\sum \phi \dot{m}/\rho = 0 \quad (33)$$

Before imposing the proppant continuity condition, the algorithm may check the nature of the branches 504 at the junction 590 to determine whether each branch 504 acts as a donor or a receiver. The term donor refers to branches with proppant flowing (i.e., mass flow) from the fracture 504 to the junction 590, while the term receiver refers to branches with a mass flow rate from the junction 590 to the fracture 504. Enforcement of the overall mass continuity ensures there would be at least one donor and one receiver branch.

In determining the proppant continuity condition, it may be assumed that all the outgoing streams of proppant (i.e., donors) have the same proppant volume fraction ϕ. This assumption is physically conservative and helps the computation of the junction variables remain stable. Indeed, this assumption may help to provide a stable solution for the entire fracture network, regardless of the number of junctions present. In other embodiments, the proppant continuity condition may be a weighted distribution of outgoing proppant volume fractions. For example, the outgoing proppant volume fractions ϕ for each branch 504 may be weighted based on mass flux of the fluid through the branch. The values of ϕ at each branch 504 may be bounded on both sides between 0 and 1.

For the donor branches, the proppant volume fraction ϕ depends on the last interior node on the fracture 504, while for the receiver branches, the nodes may share the same junction proppant volume fraction, $\phi_J$. With these assumptions in mind, the proppant continuity equation in its full form is shown below as equation 34. In this equation, the term l represents the index of the last interior node on a donor branch. That is, the value of l may be 0 for branches with the in end condition at the junction 590, and the value of l may be N for the other branches, based on the indexing scheme illustrated in FIG. 11. The term Ṁ may represent the mass flow rate for each of the branches 504 on the junction 590. For example, Ṁ may be equal to $\dot{m}_{in}$ for branches with the ṁ end condition at the junction 590, and Ṁ may be equal to $\dot{m}_N$ for the other branches. The term $n_1$ may represent the number of donor branches and $n_2$ may represent the number of receiver branches on a junction 590.

$$\frac{\phi_J}{\rho_J} \sum_{j=1}^{n_1} \dot{M}_j - \sum_{k=1}^{N_2} \dot{M}_k \frac{\phi_k}{\rho_k} = 0 \quad (34)$$

The above non-linear equation 34 may then be linearized, and the variables from equations 20 and 21 may be substituted into equation 34 to form a system that involves only junction variables. Similarly, for an unsteady mass continuity, an unsteady proppant continuity equation 35 may be used.

$$\frac{\partial A_J \phi_J}{\partial t} + \sum \phi \dot{m}/\rho = 0 \qquad (35)$$

Along with the unsteady proppant continuity equation, the following equations 36 and 37 may also be solved to provide closure to the system of equations.

$$\mu_J = f(\phi_J, P_J, \ldots) \qquad (36)$$

$$\rho_J = f(\phi_J, P_J, \ldots) \qquad (37)$$

To illustrate the enforcement of the proppant flow continuity condition described above, an example is provided considering the junction 590 modeled in FIG. 12. In this example, the branch 1 (i.e., 504B) may be the donor branch and the other two branches 504A may be the receivers. Under these assumptions, the following equation 38 shows the proppant continuity equation for the junction 590 of FIG. 12. For a similar donor/receiver configuration in FIG. 13, the proppant continuity equation 39 is also provided.

$$\frac{\phi_J}{\rho_J}(\dot{m}_{in,2} + \dot{m}_{in,3}) - \phi_{N,1}\dot{m}_{N,1}/\rho_{N,1} = 0 \qquad (38)$$

$$\frac{\phi_J}{\rho_J}(\dot{m}_{N,2} + \dot{m}_{in,3}) - \phi_{N,1}\dot{m}_{N,1}/\rho_{N,1} = 0 \qquad (39)$$

Figure 14:
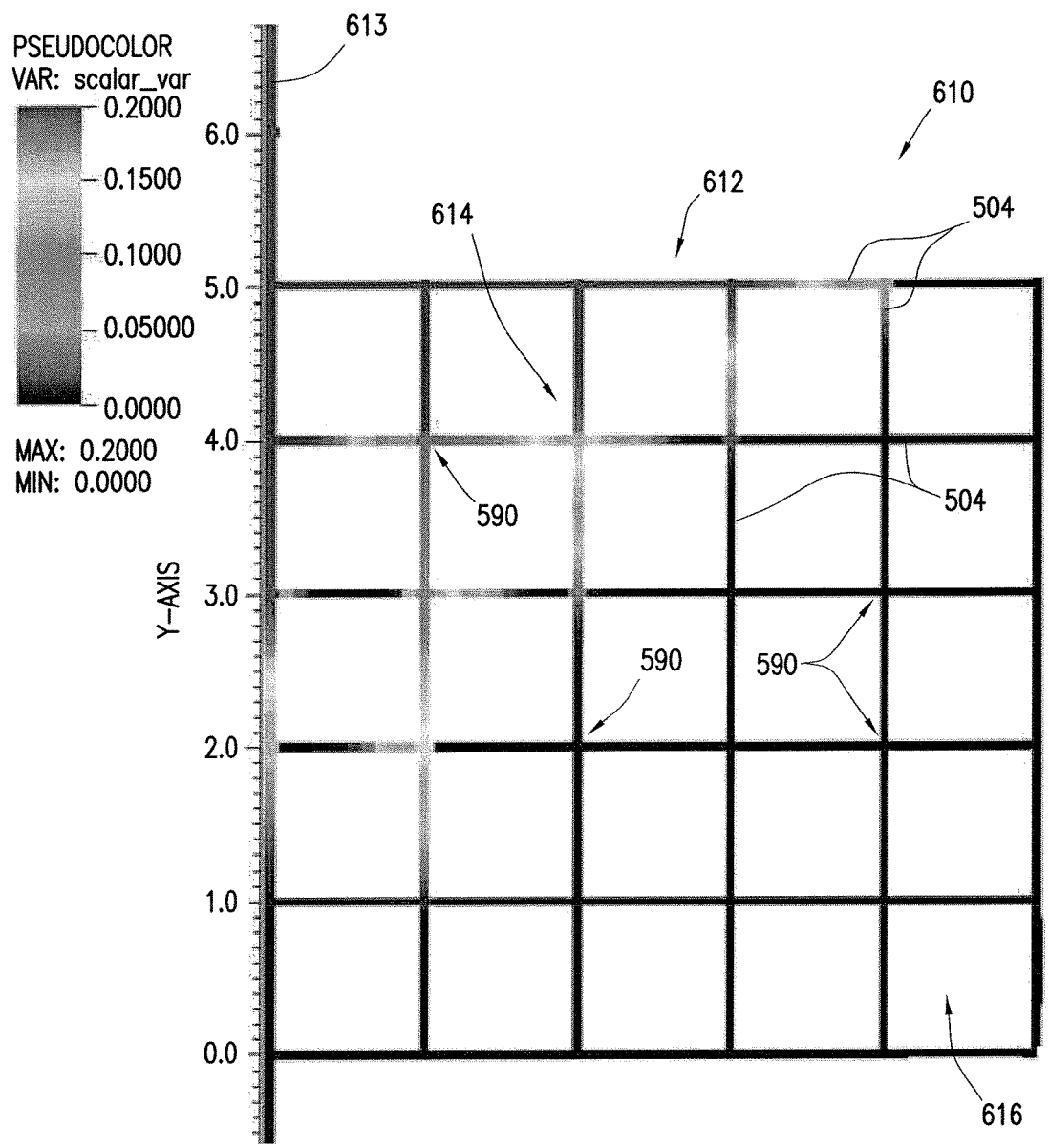
FIG. 14 is a plot illustrating a simulated flow of fluid and proppant through a fracture network, in accordance with an embodiment of the present disclosure.

The above described algorithm may be utilized to compute proppant transport in a dynamic fracture network. FIG. 14 provides a plot 610 illustrating a simulation of the results of this proppant flow computation for a dynamic fracture network 612. The geometry of the fracture network 612 is shown as a grid in the illustrated embodiment, with an X-axis 613 representing a flowpath through the wellbore connected to the fracture network 612. Proppant laden fluid may be pumped down the wellbore flowpath and into the fracture network 612. Different colors shown in the different fractures 504 may represent a varying concentration of proppant 614 in the fracture fluid flowing through certain fractures 504 at a given time. As can be seen in the plot, the proppant 614 may spread along with a fluid flow 616 through the various fractures 504 and junctions 590 that make up the dynamic fracture network 612. Throughout the simulation, the values of the proppant 614 remain bounded, indicating a correctness of the algorithm.

Although the present disclosure and its advantages have been described in detail, it should be understood that various changes, substitutions and alterations can be made herein without departing from the spirit and scope of the disclosure as defined by the following claims.

What is claimed is:

1. A tangible, non-transitory, computer-readable medium comprising machine-readable instructions to:
   receive inputs, with a processing unit, indicative of a property of a fracture within a dynamic fracture network;
   perform, with the processing unit, a spatial discretization of non-linear coupled equations representing Navier-Stokes equations with proppant transport by integrating the equations over staggered finite control volumes along a length of the fracture;
   determine, with the processing unit, a linear system of equations to solve for variables of the equations based on the spatial discretization; and
   display, for use with a subterranean operation, a simulation representative of a flow of proppant through the fracture based on solutions determined for the linear system of equations.

2. The tangible, non-transitory, computer-readable medium of claim 1, wherein the non-linear coupled equations comprise at least a continuity equation representative of fluid flowing through the fracture, a momentum equation representative of the fluid flowing through the fracture, and a proppant equation representative of a proppant flowing with the fluid through the fracture.

3. The tangible, non-transitory, computer-readable medium of claim 2, further comprising machine-readable instructions to:
   integrate the continuity equation over a first control volume;
   integrate the momentum equation over a second control volume staggered with respect to the first control volume; and
   integrate the proppant equation over the first control volume.

4. The tangible, non-transitory, computer-readable medium of claim 1, further comprising machine-readable instructions to:
   perform a temporal discretization of the non-linear coupled equations after performing the spatial discretization to determine the linear system of equations.

5. The tangible, non-transitory, computer-readable medium of claim 1, further comprising machine-readable instructions to:
   perform a second order linearization of the discretized equations to determine the linear system of equations.

6. The tangible, non-transitory, computer-readable medium of claim 1, further comprising machine-readable instructions to:
   update the displayed simulation with respect to time.

7. The tangible, non-transitory, computer-readable medium of claim 1, further comprising machine-readable instructions to:
   solve the linear system of equations to determine values of variables at endpoints of the fracture.

8. A method, comprising:
   receiving inputs indicative of a property of a fracture present within a dynamic fracture network via a processing component;
   integrating a continuity equation representative of fluid flowing through the fracture over a first control volume disposed along a length of the fracture via the processing component;
   integrating a momentum equation representative of the fluid flowing through the fracture over a second control volume disposed along the length of the fracture, wherein the second control volume is staggered with respect to the first control volume via the processing component;
   integrating a proppant equation representative of a proppant flowing with the fluid through the fracture over the first control volume via the processing component;
   determining a linear system of equations to solve for variables of the continuity equation, the momentum equation, and the proppant equation based on the integrations of the continuity, momentum, and proppant equations over the respective first and second control volumes via the processing component; and displaying, for use with a subterranean operation, a simulation representative of a flow of the proppant through the fracture based on determined solutions to the linear system of equations via a display coupled to the processing component.

9. The method of claim 8, wherein the continuity equation, the momentum equation, and the proppant equation are non-linear coupled equations.

10. The method of claim 8, wherein the continuity equation, the momentum equation, and the proppant equation conform to full Navier-Stokes equations with proppant transport.

11. The method of claim 8, further comprising performing an upwind interpolation of a variable in the proppant equation to estimate the variable at opposite faces of the first control volume while integrating the proppant equation over the first control volume.

12. The method of claim 8, wherein the variables of the continuity equation, the momentum equation, and the proppant equation comprise vector variables and scalar variables, and wherein the vector variables are staggered with respect to the scalar variables along the length of the fracture.

13. The method of claim 12, wherein the scalar variables comprise a pressure, a density of the fluid, a viscosity of the fluid, an aperture area of the fracture, and a proppant volumetric fraction, and wherein the vector variables comprise a mass flow rate.

14. The method of claim 8, wherein determining the linear system of equations comprises performing a temporal discretization of the integrated continuity, momentum, and proppant equations, and performing a second order linearization of the discretized equations.

15. The method of claim 8, wherein the inputs are indicative of an initial geometry of the fracture based on an aperture area of the fracture along the length of the fracture.

16. The method of claim 8, further comprising determining a value of variables along the length of the fracture based on variables solved for at opposite endpoints of the fracture.

17. The method of claim 8, further comprising representing the continuity equation, the momentum equation, and the proppant equation based on a transformed variable indicative of a mass flow rate of the fluid through the fracture.

18. A fracture flow simulation system, comprising:
   a user interface for inputting one or more properties of a fracture present within a dynamic fracture network;
   a first processing component coupled to the user interface and a memory device containing a set of instructions that, when executed by the first processing component cause the first processing component to perform a spatial discretization of Navier-Stokes equations representing a flow of fluid and proppant transported through the fracture over at least two staggered control volumes, and to determine a linear system of equations to solve for variables of the Navier-Stokes equations with proppant transport based on the spatial discretization; and
   a display coupled to the first processing component to display, for use with a subterranean operation, a simulation representative of a flow of proppant through the fracture based on solutions to the linear system of equations.

19. The fracture flow simulation system of claim 18, further comprising a second processing component coupled to the first processing component, wherein the memory device contains a set of instructions that, when executed by the second processing component cause the second processing component to solve for variables at junctions between a plurality of fractures present within the dynamic fracture network.

20. The fracture flow simulation system of claim 18, wherein the one or more properties are indicative of an initial geometry of the fracture based on an aperture area of the fracture along the length of the fracture.

* * * * *